(12) United States Patent
Yoo et al.

(10) Patent No.: US 9,392,706 B2
(45) Date of Patent: Jul. 12, 2016

(54) MOBILE TERMINAL

(71) Applicant: LG ELECTRONICS INC., Seoul (KR)

(72) Inventors: Inseok Yoo, Seoul (KR); Huiseob Byun, Seoul (KR); Jaewook Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 352 days.

(21) Appl. No.: 13/738,588

(22) Filed: Jan. 10, 2013

(65) Prior Publication Data

US 2013/0242479 A1    Sep. 19, 2013

(30) Foreign Application Priority Data

Mar. 16, 2012  (KR) .................. 10-2012-0027286

(51) Int. Cl.
  *H05K 5/00*      (2006.01)
  *H05K 7/00*      (2006.01)
  *H03K 17/94*     (2006.01)
  *H04M 1/02*      (2006.01)
  *G01J 1/04*      (2006.01)
  *G01J 1/42*      (2006.01)
  *H04M 1/22*      (2006.01)

(52) U.S. Cl.
  CPC ............ *H05K 5/0017* (2013.01); *G01J 1/0407* (2013.01); *G01J 1/0455* (2013.01); *G01J 1/4204* (2013.01); *H03K 17/941* (2013.01); *H04M 1/026* (2013.01); *H03K 2217/94108* (2013.01); *H04M 1/22* (2013.01); *H04M 2250/12* (2013.01)

(58) Field of Classification Search
  CPC ............ H04M 1/22; F16F 1/022; F16F 1/185
  USPC ............... 361/679.01–679.09, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8
  See application file for complete search history.

(56) References Cited

U.S. PATENT DOCUMENTS 5,831,268 A * 11/1998 Morita .................. G01F 23/292
                                             250/341.8
2007/0274101 A1   11/2007 Cho et al.
2008/0158173 A1    7/2008 Hamblin et al.
2010/0207879 A1    8/2010 Fadell et al.

(Continued)

FOREIGN PATENT DOCUMENTS

CN    101776772 A    7/2010
EP    1085731        3/2001

(Continued)

OTHER PUBLICATIONS

European Search Report for Application No. 13000788.3, dated Jun. 6, 2013.

(Continued)

*Primary Examiner* — Jerry Wu
(74) *Attorney, Agent, or Firm* — KED & Associates LLP

(57) ABSTRACT

A mobile terminal may be provided that includes a case having a through window formed in front of the case, an optical sensor arranged in the case toward the through window, a glass formed of an opaque material to cover the through window of the case, and a window layer disposed on a behind face of the glass, with a fine hole formed above the optical sensor.

10 Claims, 8 Drawing Sheets

(56) References Cited

U.S. PATENT DOCUMENTS

2010/0273530 A1* 10/2010 Jarvis et al. ................ 455/566
2011/0053653 A1 3/2011 Tho et al.

FOREIGN PATENT DOCUMENTS

| EP | 2204640 | 7/2010 |
| EP | 2565603 | 3/2013 |
| WO | WO 2012/068213 | 5/2012 |

OTHER PUBLICATIONS

Chinese Office Action issued in Application No. 201310054771.4 dated Feb. 4, 2015. (with English Translation).

* cited by examiner

MOBILE TERMINAL

CROSS-REFERENCE TO RELATED APPLICATION

This application claims benefit and priority from Korean Application No. 10-2012-0027286, filed Mar. 16, 2012, the subject matter of which is hereby incorporated by reference.

BACKGROUND

1. Field

Embodiments may relate to a mobile terminal that may reduce a dark region formed by opening a window layer for an optical sensor in a bezel region and having a united front design.

2. Background

Mobile terminals may perform a variety of functions to satisfy consumer demand. These functions may include multimedia functions in a form of recording images and video, playing music and games, and receiving broadcasting or internet signals. Mobile terminals may have flaws that relate to hardware terminal and structural design, software operability, and communication and processing efficiency, for example.

BRIEF DESCRIPTION OF THE DRAWINGS

Arrangements and embodiments may be described in detail with reference to the following drawings in which like reference numerals refer to like elements and wherein.

DETAILED DESCRIPTION

In the following detailed description, reference may be made to accompanying drawing figures that form a part hereof, and that show by way of illustration specific embodiments.

As used herein, suffixes 'module', 'unit' and 'part' may be used for elements in order to facilitate the disclosure. Therefore, significant meanings or roles may not be given to the suffixes themselves and it should be understood that the 'module', 'unit' and 'part' may be used together or interchangeably.

Embodiments may be applicable to various types of mobile terminals. Examples of such terminals may include mobile phones, user equipment, smart phones, digital broadcast receivers, personal digital assistants, laptop computers, portable multimedia players (PMP), navigators and/or the like.

An embodiment disclosed in this specification may be applicable to a fixed terminal such as a digital TV, a display, a desktop computer and/or the like, as well as a mobile terminal.

Figure 1:
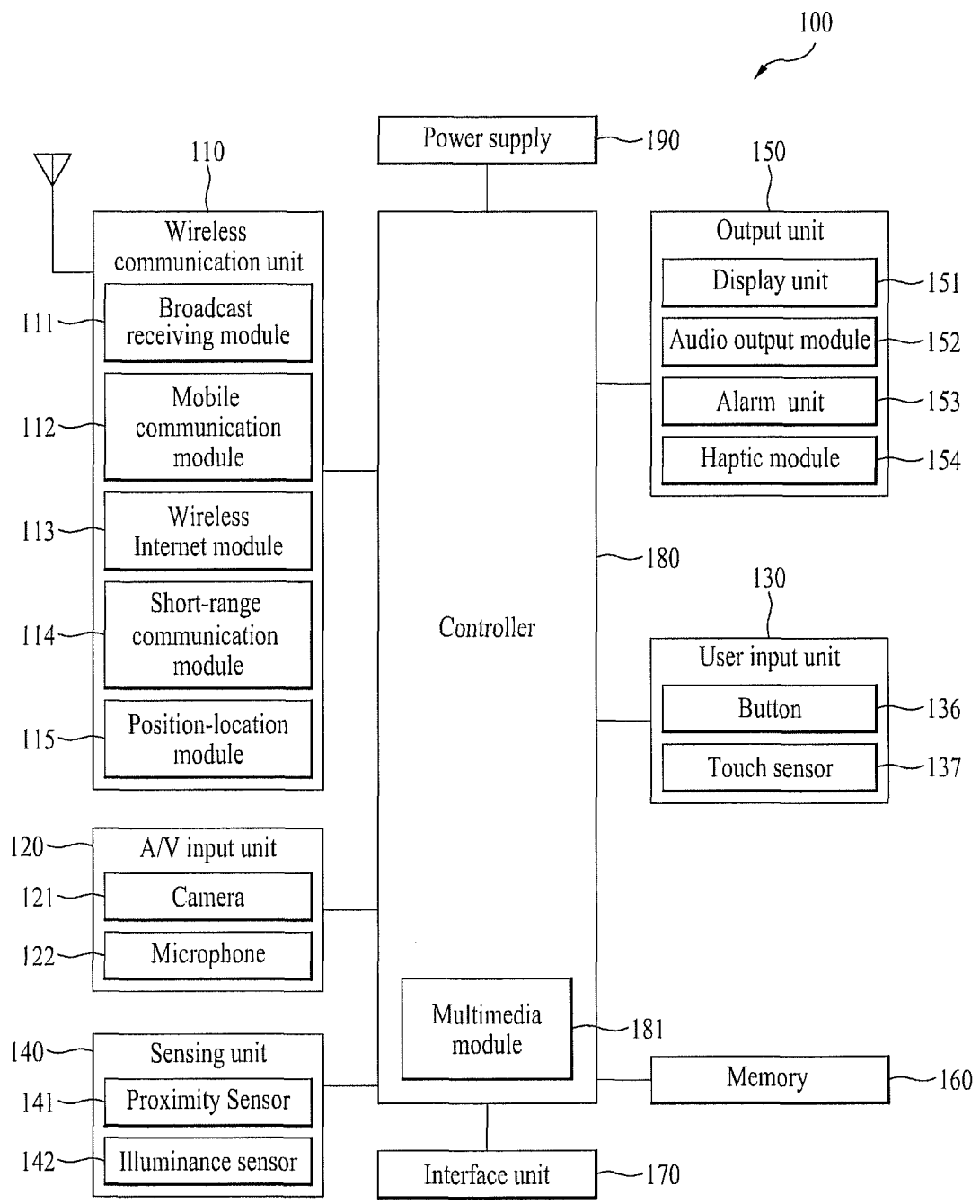
FIG. 1 is a block diagram of a mobile terminal according to one embodiment.

FIG. 1 is a block diagram of a mobile terminal in accordance with an embodiment. Other arrangements and embodiments may also be provided.

FIG. 1 shows a mobile terminal 100 that includes a wireless communication unit 110, an A/V (audio/video) input unit 120, a user input unit 130, a sensing unit 140, an output unit 150, a memory 160, an interface unit 170, a controller 180, a power supply 190 and the like. FIG. 1 shows the mobile terminal 100 having various components, although it is understood that implementing all of the illustrated components is not a requirement. Greater or fewer components may alternatively be implemented.

The wireless communication unit 110 may include one or more components that permit wireless communication between the mobile terminal 100 and a wireless communication system or network within which the mobile terminal 100 is located. For example, the wireless communication unit 110 may include a broadcast receiving module 111, a mobile communication module 112, a wireless internet module 113, a short-range communication module 114, a position-location module 115 and/or the like.

The broadcast receiving module 111 may receive a broadcast signal and/or broadcast associated information from an external broadcast managing server via a broadcast channel. The broadcast channel may include a satellite channel and a terrestrial channel. At least two broadcast receiving modules 111 may be provided to the mobile terminal 100 in pursuit of simultaneous receptions of at least two broadcast channels or broadcast channel switching facilitation.

The broadcast managing server may refer to a server that generates and transmits a broadcast signal and/or broadcast associated information or a server that is provided with a previously generated broadcast signal and/or broadcast associated information and then transmits the provided signal or information to a terminal. The broadcast signal may be implemented as a TV broadcast signal, a radio broadcast signal, and/or a data broadcast signal, for example. The broadcast signal may further include a broadcast signal combined with a TV or radio broadcast signal.

The broadcast associated information may include information associated with a broadcast channel, a broadcast program, a broadcast service provider, etc. The broadcast associated information may be provided via a mobile communication network. The broadcast associated information may be received by the mobile communication module 112.

The broadcast associated information may be implemented in various forms. For example, broadcast associated information may include an electronic program guide (EPG) of digital multimedia broadcasting (DMB) and electronic service guide (ESG) of digital video broadcast-handheld (DVB-H).

The broadcast receiving module 111 may be configured to receive broadcast signals transmitted from various types of broadcast systems. Non-limiting examples of broadcasting systems may include digital multimedia broadcasting-terrestrial (DMB-T), digital multimedia broadcasting-satellite (DMB-S), digital video broadcast-handheld (DVB-H), Convergence of Broadcasting and Mobile Service (DVB-CBMS), Open Mobile Alliance-BroadCAST (OMA-BCAST), China Multimedia Mobile Broadcasting (CMMB), Mobile Broadcasting Business Management System (MBBMS), the data broadcasting system known as media forward link only (MediaFLO®) and/or integrated services digital broadcast-terrestrial (ISDB-T). The broadcast receiving module 111 may be configured suitable for other broadcasting systems as well as the above-described digital broadcasting systems.

The broadcast signal and/or broadcast associated information received by the broadcast receiving module 111 may be stored in a suitable device, such as the memory 160.

The mobile communication module 112 may transmit/receive wireless signals to/from one or more network entities (e.g., base station, external terminal, server, etc.) via a mobile network such as GSM (Global System for Mobile communications), CDMA (Code Division Multiple Access), WCDMA (Wideband CDMA) and so on. Such wireless signals may represent audio, video, and data according to text/multimedia message transceivings, for example.

The wireless internet module 113 may support Internet access for the mobile terminal 100. The wireless Internet module 113 may be internally or externally coupled to the mobile terminal 100. The wireless Internet technology may include WLAN (Wireless LAN) (Wi-Fi), Wibro (Wireless broadband), Wimax (World Interoperability for Microwave Access), HSDPA (High Speed Downlink Packet Access), GSM, CDMA, WCDMA, LTE (Long Term Evolution) etc.

Wireless internet access by Wibro, HSPDA, GSM, CDMA, WCDMA, LTE and/or the like may be achieved via a mobile communication network. The wireless internet module 113 configured to perform wireless internet access via the mobile communication network may be considered as part of the mobile communication module 112.

The short-range communication module 114 may facilitate relatively short-range communication. Suitable technologies for implementing the short-range communication module may include radio frequency identification (RFID), infrared data association (IrDA), ultra-wideband (UWB), as well as networking technologies commonly referred to as Bluetooth and ZigBee.

The position-location module 115 may identify or otherwise obtain a location of the mobile terminal 100. The position-location module 115 may be implemented with a global positioning system (GPS) module. The GPS module may precisely calculate current 3-dimensional position information based on at least one of longitude, latitude and altitude and direction (or orientation) by calculating distance information and precise time information from at least three satellites and then applying triangulation to the calculated information. Location and time information may be calculated using three satellites, and errors of the calculated location position and time information may then be amended using another satellite. The GPS module may calculate speed information by continuously calculating a real-time current location.

The audio/video (NV) input unit 120 may be configured to provide audio or video signal input to the mobile terminal 100. The A/V input unit 120 may include a camera 121 and a microphone 122. The camera 121 may receive and process image frames of still pictures or video that are obtained by an image sensor in a video call mode or a photographing mode. The processed image frames may be displayed on the display 151.

The image frames processed by the camera 121 may be stored in the memory 160 or may be externally transmitted via the wireless communication unit 110. At least two cameras 121 may be provided to the mobile terminal 100 according to environment of usage.

The microphone 122 may receive an external audio signal while the mobile terminal 100 is in a particular mode, such as a phone call mode, a recording mode and/or a voice recognition. This audio signal may be processed and converted into electric audio data. The processed audio data may be transformed into a format transmittable to a mobile communication base station via the mobile communication module 112 in case of a call mode. The microphone 122 may include assorted noise removing algorithms (or noise cancelling algorithm) to remove noise generated in course of receiving the external audio signal.

The user input unit 130 may generate input data responsive to user manipulation of an associated input device or devices. Examples of such devices may include a button 136 provided at a front/rear/lateral side of the mobile terminal 100 and a touch sensor (constant pressure/electrostatic) 137, and may further include a key pad, a dome switch, a jog wheel, a jog switch and/or the like.

The sensing unit 140 may provide sensing signals for controlling operations of the mobile terminal 100 using status measurements of various aspects of the mobile terminal 100. For example, the sensing unit 140 may detect an open/close status of the mobile terminal 100, relative positioning of components (e.g., a display and keypad) of the mobile terminal 100, a change of position of the mobile terminal 100 or a component of the mobile terminal 100, a presence or absence of user contact with the mobile terminal 100, orientation or acceleration/deceleration of the mobile terminal 100. Examples of the sensing unit 140 may include a gyro sensor, an accelerate sensor, and a geomagnetic sensor.

As an example, the mobile terminal 100 may be configured as a slide-type mobile terminal. In this configuration, the sensing unit 140 may sense whether a sliding portion of the mobile terminal 100 is open or closed. In other examples, the sensing unit 140 may sense presence or absence of power provided by the power supply 190, presence or absence of a coupling or other connection between the interface unit 170 and an external device. The sensing unit 140 may include a proximity sensor 141.

The output unit 150 may generate outputs relevant to senses of sight, hearing, touch and/or the like. The output unit 150 may include the display 151 (or the display unit), an audio output module 152, an alarm unit 153 (or alarm), and a haptic module 154 and/or the like.

The display 151 may be implemented to visually display (i.e., output) information associated with the mobile terminal 100. For example, if the mobile terminal 100 is operating in a phone call mode, the display 151 may provide a user interface (UI) or a graphical user interface (GUI) that includes information associated with placing, conducting, and terminating a phone call. As another example, if the mobile terminal 100 is in a video call mode or a photographing mode, the display 151 may additionally or alternatively display images that are associated with these modes, the UI or the GUI.

The display 151 (or display module) may be implemented using known display technologies including a liquid crystal display (LCD), a thin film transistor-liquid crystal display (TFT-LCD), an organic light-emitting diode display (OLED), a flexible display and a three-dimensional display, for example. The mobile terminal 100 may include one or more of such displays.

Some of the displays may be implemented in a transparent or optical transmittive type, which may be called a transparent display. An example of the transparent display may be a TOLED (transparent OLED) and/or the like. A rear configuration of the display 151 may be implemented in optical transmittive type as well. In this configuration, a user may be able to see an object in rear of a terminal body via the area occupied by the display 151 of the terminal body.

At least two displays 151 may be provided to the mobile terminal 100. For example, a plurality of displays may be arranged on a single face of the mobile terminal 100 in a manner of being spaced apart from each other or by being built in one body. Alternatively, a plurality of displays may be arranged on different faces of the mobile terminal 100.

In an example that the display 151 and the touch sensor 137 are configured as a mutual layer structure (hereinafter called a touch screen), the display 151 may be used as an input device as well as an output device. The touch sensor may be configured as a touch film, a touch sheet, a touchpad and/or the like.

The touch sensor 137 may be configured to convert a pressure applied to a specific portion of the display 151 or a variation of a capacitance generated from a specific portion of the display 151 to an electric input signal. The touch sensor 137 may be configured to detect a pressure of a touch as well as a touched position or size.

If a touch input is made to the touch sensor 137, signal(s) corresponding to the touch may be transferred to a touch controller. The touch controller may process the signal(s) and then transfer the processed signal(s) to the controller 180. Therefore, the controller 180 may know whether a prescribed portion of the display 151 is touched.

The proximity sensor 141 may be provided to an internal area of the mobile terminal 100 enclosed by the touchscreen and/or around the touchscreen. The proximity sensor 141 may detect a presence or a non-presence of an object approaching a prescribed detecting surface or an object existing around the proximity sensor 141 using an electromagnetic field strength or infrared ray without mechanical contact. The proximity sensor 141 may have durability longer than a contact type sensor and may also have utility wider than the contact type sensor.

The proximity sensor 141 may include one of a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, an infrared proximity sensor and/or the like. If the touchscreen includes the electrostatic capacity proximity sensor, it may be configured to detect proximity of a pointer using a variation of electric field according to proximity of the pointer. In this example, the touchscreen (touch sensor) may be classified as the proximity sensor 141.

For ease of description, as a pointer becomes proximate to a touchscreen without contacting the touchscreen, if the pointer is perceived as situated over the touchscreen, such an action may be called a proximity touch. If a pointer actually contacts a touchscreen, such an action may be called a contact touch. A proximity-touched position over the touchscreen with the pointer may mean a position at which the pointer vertically opposes the touchscreen when the touchscreen is proximity-touched with the pointer.

The proximity sensor may detect a proximity touch and a proximity touch pattern (e.g., a proximity touch distance, a proximity touch duration, a proximity touch position, a proximity touch shift state, etc.). Information corresponding to the detected proximity touch action and the detected proximity touch pattern may be outputted to the touchscreen.

The audio output module 152 may function in various modes including a call-receiving mode, a call-placing mode, a recording mode, a voice recognition mode, a broadcast reception mode and/or the like to output audio data that is received from the wireless communication unit 110 or is stored in the memory 160. During operation, the audio output module 152 may output audio relating to a particular function (e.g., call received, message received, etc.). The audio output module 152 may be implemented using one or more speakers, buzzers, other audio producing devices, and/or combinations thereof.

The alarm unit 153 (or the alarm) may output a signal for announcing occurrence of a particular event associated with the mobile terminal 100. Events may include a call received event, a message received event and a touch input received event. The alarm unit 153 may output a signal for announcing the event occurrence by way of vibration as well as video or audio signal. The video or audio signal may be outputted via the display 151 or the audio output unit 152. The display 151 or the audio output module 152 may be considered as a part of the alarm unit 153.

The haptic module 154 may generate various tactile effects that can be sensed by a user. Vibration may be a representative one of the tactile effects generated by the haptic module 154. Strength and pattern of the vibration generated by the haptic module 154 may be controllable. For example, different vibrations can be outputted in a manner of being synthesized together or can be outputted in sequence.

The haptic module 154 may generate various tactile effects as well as vibration. For example, the haptic module 154 may generate an effect attributed to the arrangement of pins vertically moving against a contact skin surface, an effect attributed to injection/suction power of air though an injection/suction hole, an effect attributed to skim over a skin surface, an effect attributed to contact with electrode, an effect attributed to electrostatic force, an effect attributed to representation of hold/cold sense using an endothermic or exothermic device and/or the like.

The haptic module 154 may enable a user to sense a tactile effect through a muscle sense of finger, arm and/or the like as well as to transfer the tactile effect through a direct contact. At least two haptic modules 154 may be provided at the mobile terminal 100 based on the corresponding configuration of the mobile terminal 100.

The memory 160 (or memory unit) may store various types of data to support processing, control, and storage requirements of the mobile terminal 100. Examples of such data may include program instructions for applications operating on the mobile terminal 100, contact data, phonebook data, messages, audio, still pictures (or photo), moving pictures, and/or etc. A recent use history or a cumulative use frequency of each data (e.g., use frequency for each phonebook, each message or each multimedia) may be stored in the memory 160. Data for various patterns of vibration and/or sound outputted in case of a touch input to the touchscreen may be stored in the memory 160.

The memory 160 may be implemented using any type or combination of suitable volatile and non-volatile memory or storage devices including hard disk, random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, multimedia card micro type memory, card-type memory (e.g., SD memory, XD memory, etc.), and/or other similar memory or data storage device. The mobile terminal 100 may operate in association with a web storage for performing a storage function of the memory 160 on Internet.

The interface unit 170 may be used to couple the mobile terminal 100 with external devices. The interface unit 170 may receive data from the external devices and/or may be supplied with power and then transfer the data or power to the respective elements of the mobile terminal 100 or enable data within the mobile terminal 100 to be transferred to the external devices. The interface unit 170 may be configured using a wired/wireless headset port, an external charger port, a wired/wireless data port, a memory card port, a port for coupling to a device having an identity module, audio input/output ports, video input/output ports, an earphone port and/or the like.

The identity module may be chip for storing various kinds of information for authenticating a use authority of the mobile terminal 100, and may include a User Identify Module (UIM), a Subscriber Identify Module (SIM), a Universal Subscriber Identity Module (USIM) and/or the like. A device having the identity module (hereinafter called an identity device) may be manufactured as a smart card. The identity device may be connectible to the mobile terminal 100 via the corresponding port.

When the mobile terminal 110 is connected to an external cradle, the interface unit 170 may become a passage for supplying the mobile terminal 100 with a power from the cradle or a passage for delivering various command signals inputted from the cradle by a user to the mobile terminal 100. Each of the various command signals inputted from the cradle or the power may operate as a signal enabling the mobile terminal 100 to recognize that it is correctly loaded in the cradle.

The controller 180 may control over all operations of the mobile terminal 100. For example, the controller 180 may perform control and processing associated with voice calls, data communications, video calls, etc. The controller 180 may include a multimedia module 181 that provides multimedia playback. The multimedia module 181 may be configured as part of the controller 180, or may be implemented as a separate component.

The controller 180 may perform a pattern (or image) recognizing process for recognizing a writing input and a picture drawing input carried out on the touchscreen as characters or images, respectively.

The power supply 190 may provide power required by various components for the mobile terminal 100. The power may be internal power, external power, and/or combinations thereof.

Figure 2:
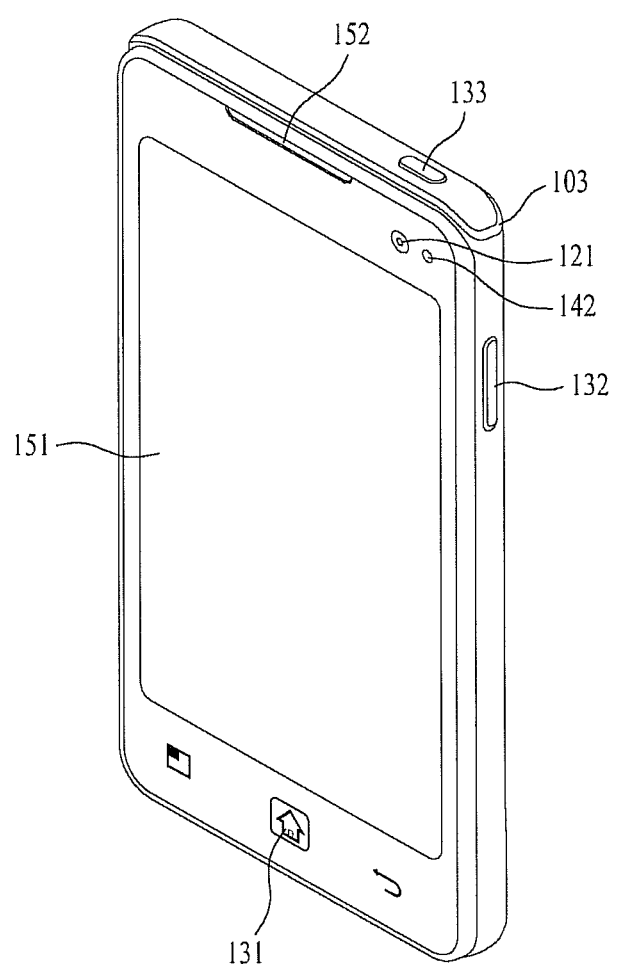
FIG. 2 is a front perspective diagram of a mobile terminal according to one embodiment.

FIG. 2 is a front perspective diagram of a mobile terminal according to one embodiment. Other arrangements and configurations may also be provided.

As shown in FIG. 2, the mobile terminal 100 may have a bar type terminal body. The mobile terminal 100 may be implemented in a variety of different configurations. Examples of such configurations may include a folder-type, a slide-type, a rotational-type, a swing-type and/or combinations thereof. For clarity, the further description may primarily relate to a bar-type mobile terminal 100. However, such teachings may apply to other types of mobile terminals.

The mobile terminal 100 may include a case configuring an exterior thereof. The case may be divided into a front case 101 and a rear case 102. Various electric/electronic parts are loaded in a space provided between the front case 101 and the rear case 102.

Electronic components may be mounted on a surface of the rear case 102. The electronic part mounted on the surface of the rear case 102 may include such a detachable part, such as a battery, a USIM card, a memory card and/or the like. The rear case 102 may further include a backside cover 103 to cover the surface of the rear case 102. The backside cover 103 may have a detachable configuration for user's convenience. If the backside cover 103 is detached from the rear case 102, the surface of the rear case 102 may be exposed.

Referring to FIG. 2, if the backside cover 103 is attached to the rear case 102, a lateral side of the rear case 102 may be partly exposed. If a size of the backside cover 103 is decreased, a rear side of the rear case 102 may be partly exposed. If the backside cover 103 covers a whole rear side of the rear case 102, it may include an opening 103' (FIG. 4) to externally expose a camera 121' or an audio output unit 152'.

The front and rear cases 101, 102 and the backside cover 103 may be formed by injection molding of synthetic resin or may be formed of a metal substance such as stainless steel (STS), titanium (Ti) or the like, for example.

The display 151, the audio output unit 152, the camera 121, user input units 130/131 and 132, the microphone 122, the interface 170 and the like may be provided to the first and rear cases 101 or 102.

The display 151 may occupy most of a main face of the front case 101. The audio output unit 152 and the camera 121 may be provided to an area adjacent to one of both end portions of the display 151, while the user input unit 131 and the microphone 122 are provided to another area adjacent to the other end portion of the display 151. The user input unit 132 and the interface 170 may be provided to lateral sides of the front and rear cases 101 and 102.

The input unit 130 may be manipulated to receive a command for controlling an operation of the mobile terminal 100. The input unit 130 may include a plurality of manipulating units 131 and 132. The manipulating units 131 and 132 may be called a manipulating portion and may adopt any mechanism of a tactile manner that enables a user to perform a manipulation action by experiencing a tactile feeling.

Content inputted by the first or second manipulating unit 131 or 132 may be diversely set. For example, a command such as start, end, scroll and the like may be inputted to the first manipulating unit 131. A command for a volume adjustment of sound outputted from the audio output unit 152 and the like may be inputted to the second manipulating unit 132, a command for a switching to a touch recognizing mode of the display 151 and the like may be inputted to the second manipulating unit 133.

Figure 3:
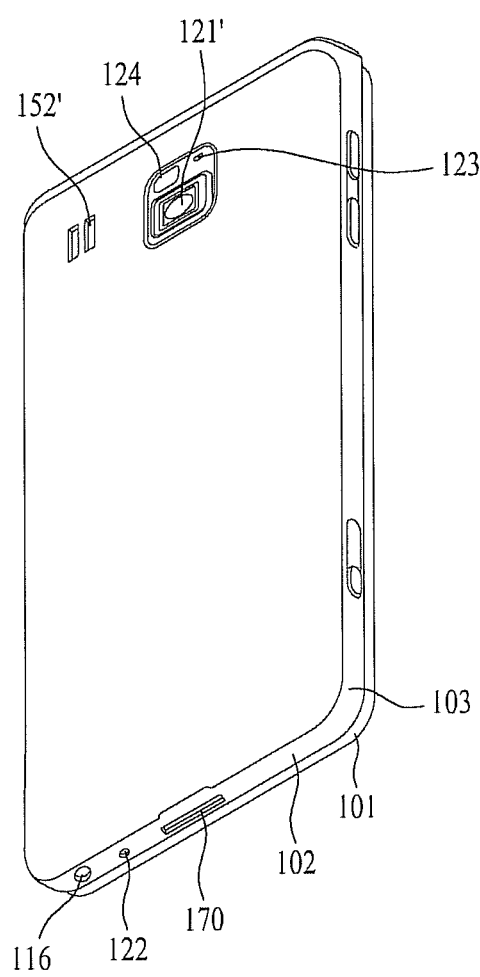
FIG. 3 is a rear perspective diagram of a mobile terminal according to one embodiment.

FIG. 3 is a perspective diagram of a backside of the mobile terminal (shown in FIG. 2). Other arrangements and configurations may also be provided.

Referring to FIG. 3, a camera 121' may be additionally provided to a backside of the terminal body, and more particularly to the rear case 102. The camera 121' may have a photographing direction that is substantially opposite to that of the camera 121 (FIG. 2) and may have pixels differing from those of the camera 121.

For example, the camera 121' may have low pixels enough to capture and transmit a picture of user's face for a video call, while the camera 121' may have high pixels for capturing a general subject for photography without transmitting the captured subject. Each of the cameras 121 and 121' may be installed at the terminal body to be rotated or popped up.

A flash 123 and a mirror 124 may be additionally provided adjacent to the camera 121'. The flash 123 may project light toward a subject in case of photographing the subject using the camera 121'. If a user attempts to take a picture of the user (self-photography) using the camera 121', the mirror 124 may enable the user to view user's face reflected by the mirror 124.

An additional audio output unit 152' may be provided to the backside of the terminal body. The additional audio output unit 152' may implement a stereo function together with the audio output unit 152 and may be used for implementation of a speakerphone mode in talking over the terminal.

Figure 4:
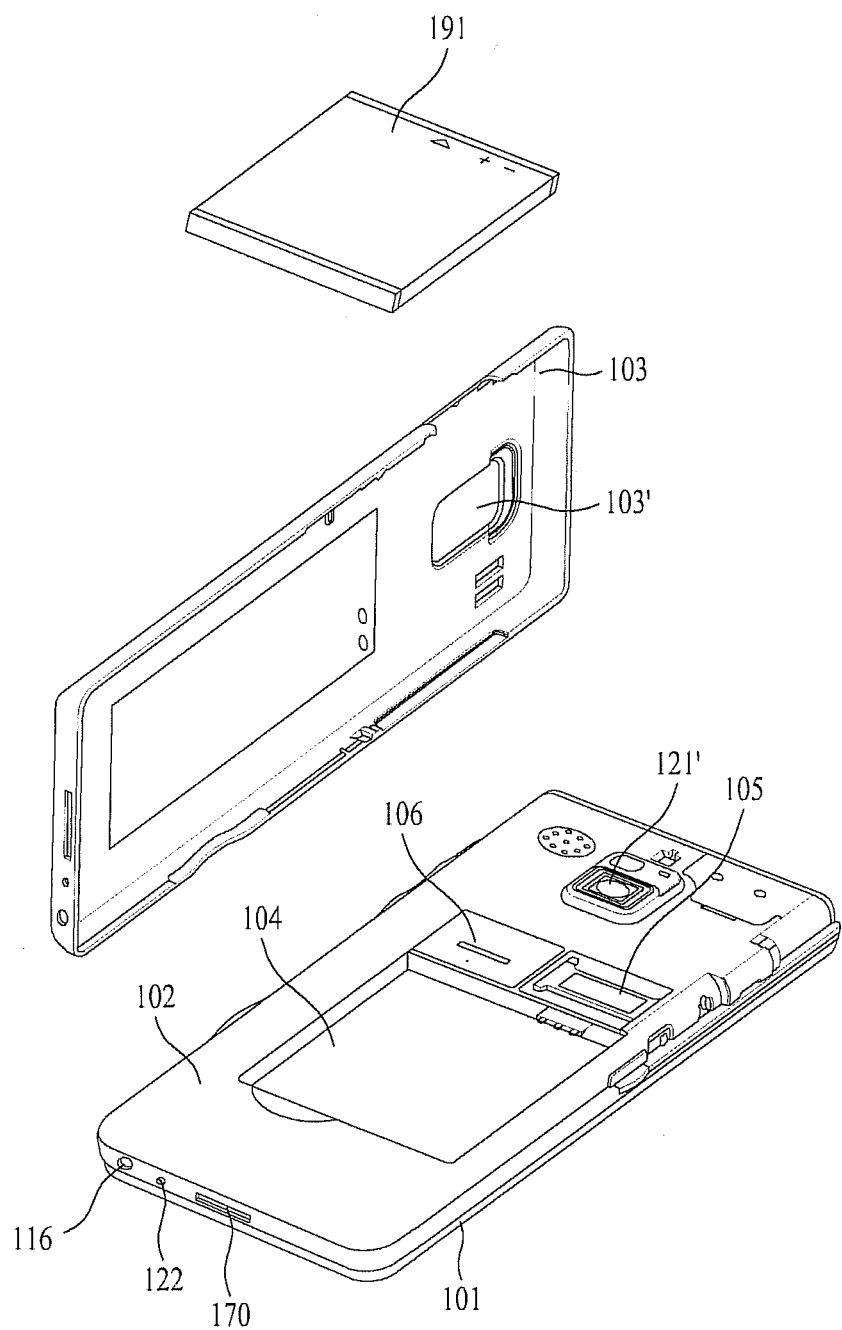
FIG. 4 is a perspective diagram of a mobile terminal according to one embodiment, and a backside cover detached from a backside of the mobile terminal.

FIG. 4 is a perspective diagram of a mobile terminal according to one embodiment, in which the backside cover 103 is detached from a backside of the mobile terminal 100. Other embodiments and configurations may also be provided FIG. 4 shows the front case 101, the rear case 102, the backside cover (or a battery cover) 103, the camera 121', the interface 170, the microphone 122, the audio output unit 152', a battery 191, a battery loading part 104, a USIM card loading part 105, a memory card loading part 106 and/or the like.

To a surface of the rear case 102, a space for mounting an external part, such as the battery loading part 104, the USIM card loading part 105, the memory card loading part 106 and/or the like, may be provided. The external components mounted on the surface of the rear case 102 may be provided to enhance various functions of the mobile terminal 100 to meet need of users.

As performance of the mobile terminal 100 is diversified and enhanced, power consumption may increase correspondingly. To compensate for this increased power consumption, a replaceable battery may be configured as shown in FIG. 4. For the replaceable type battery, the battery loading part 104 may be provided on the surface of the rear case 102 to enable a user to attach/detach the battery 191 to/from the rear case 102. A contact terminal may be provided at the battery loading part 104 to electrically connected with a part loaded within the rear case 102.

The USIM card loading part 105 or the memory card loading part 106 (as shown in FIG. 4) may be provided next to (or adjacent) the battery loading part 104. Alternatively, the USIM card loading part 105 or the memory card loading part 106 may be provided at a bottom side of the battery loading part 104 to be externally exposed when the battery 191 is detached from the battery loading part 104. A size of the battery loading part 104 may increase to enlarge a size of the battery 191.

Although FIG. 4 shows that the USIM card loading part 104 or the memory card loading part 106 provided on a rear side of the rear case 102, the USIM card loading part 104 or the memory card loading part 106 may be detachably inserted in a lateral side (or sides) of the mobile terminal 100.

As the backside cover 103 is configured to cover the surface of the rear case 102, the battery 191, the USIM card, the memory card and/or the like provided on the surface of the rear case 102 may be fixed thereto not to be separated from the rear case 102. The backside cover 103 may protect external components against external shock or particles. For an additional water-proof function, the backside cover 103 may further include a water-proof structure or means for sealing a gap between the rear case 102 and the backside cover 103 assembled together in order to prevent the external components from water.

Embodiments associated with a control method that may be implemented in the above-described mobile terminal may be described as follows.

Figure 5:
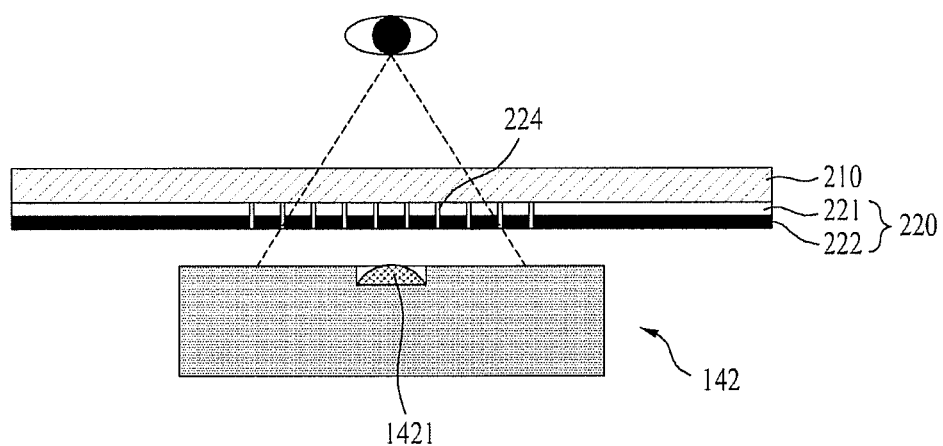
FIG. 5 is a sectional diagram of an optical sensor and a window layer provided in a mobile terminal according to one embodiment.
Figure 6:
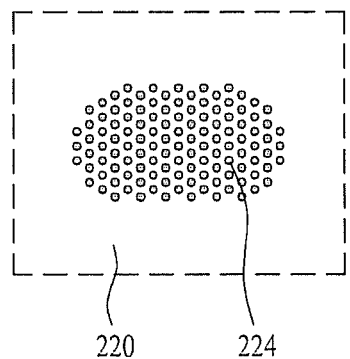
FIG. 6 is a plane diagram of the optical sensor and the window layer provided in the mobile terminal according to one embodiment.

FIG. 5 is a sectional diagram illustrating a position of an optical sensor 142 (or illuminance sensor) provided in a mobile terminal according to an example embodiment. FIG. 5 shows the optical sensor 142, a glass 210 and a window layer 220.

The mobile terminal may include the front case 101 and the rear case 102 in which electronic components are mounted, with a through window, the optical sensor 142 arranged in the front and rear cases 101 and 102 toward the through window, the glass 210 positioned beyond the optical sensor 142 to cover the through window of the front and rear cases 101 and 102, and the window layer 220 disposed on an inner surface of the glass 210, with a fine hole 224 formed beyond the optical sensor 142.

The front and rear cases 101 and 102 may have a space formed therein to mount electronic components. The front case 101 may cover a front surface, and the rear case 102 may cover a rear surface.

The front and rear cases 101 and 102 may be provided with a through window to have means for input or output to electronic components arranged therein. The through window may be formed for the display 151. A through window may also be provided for the user input 132, the audio output 152 or the interface 170 (or interface unit) for data receiving/transmitting.

The through window may be a through window corresponding to the optical sensor 142, and the through window may be formed in the front case 101 or the rear case 102. For ease of explanation, the through window may be described as being formed in the front case 101 (as shown in FIG. 2).

The case may include an independent through window for only the optical sensor 142. With a design tendency of integrated front type, not only the display 151 but also components arranged on a face may be arranged on a single large through window. The components may include the audio output module 152, the user input unit 131, the camera 121 and the optical sensor 142.

The optical sensor 142 maybe a device that senses and converts light into an electric signal that is easy to process. The light may be an electromagnetic wave, such as an infrared ray and/or a visible ray.

The optical sensor 142 may be an illuminance sensor or a proximity sensor, for example. In this embodiment, an illuminance sensor including only a light receiving unit 1421 is provided as the optical sensor 142.

The optical sensor 142 may include only the light receiving unit 1421 configured to receive lights in surroundings and use the received light in measuring a brightness of the surroundings. The brightness of the display 151 may be adjusted according to the brightness of the surroundings determined by the optical sensor 142 (or illuminance sensor). The optical sensor 142 may be very relevant to control of the display 151, and the optical sensor 142 may be positioned adjacent to the display 151.

The glass 210 may be coupled to the through window formed in the case 101 and 102 to cover a top of the optical sensor 142. In case that the through window is the through window where not only the optical sensor 142 but also the display 151, the audio output module 152 and the like are arranged, the glass 210 may cover all of the display 151, the audio output module 152 and the like.

The window layer 220 may be positioned under the glass 210. The window layer 220 may divide a face region based on arrangement of the display 151, the camera 121 and the optical sensor 142. The window layer 220 may be formed of an opaque material so as to not expose the electronic component. A black window layer 220 may be used and a brighter window layer 220 has been introduced in pursuit of various consumers' tastes. A bright color may include white and pink.

To realize the bright color window layer 220, such as a white window layer, a first layer 221 may be formed closest to the glass 210 and a dark color second layer 222 may be disposed under the first layer 221 to prevent lights from leaking from the other region except the display 151.

Figure 7:
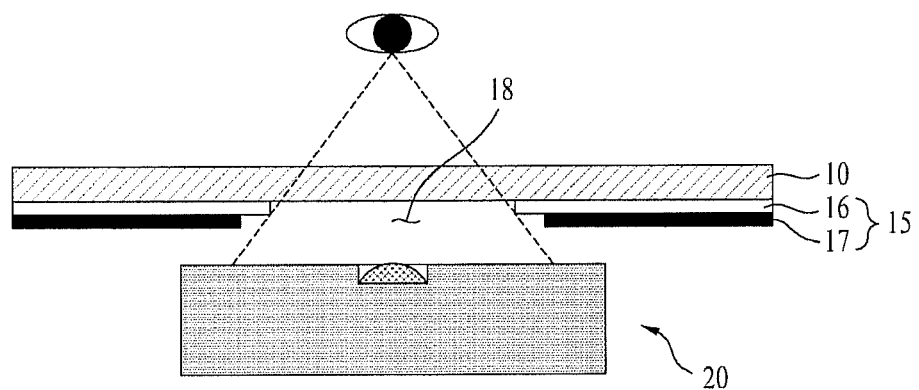
FIG. 7 is a sectional diagram of an optical sensor and a window layer provided in a mobile terminal.
Figure 8:
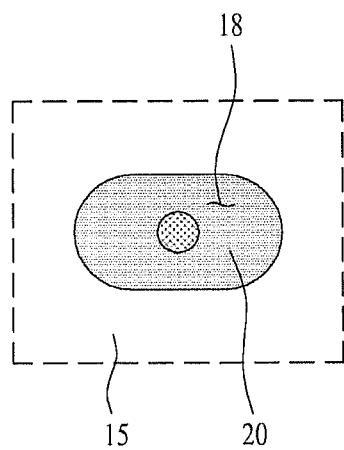
FIG. 8 is a plane diagram of the optical sensor and the window layer of the mobile terminal.

FIGS. 7 and 8 are sectional and plane diagrams of a mobile terminal according to another arrangement. As shown in FIGS. 7 and 8, a window layer 10 may be formed of an opaque material and an opening 18 may be formed in a predetermined area of the window layer 10 where the optical sensor 20 is provided. Accordingly, light may be transmitted via the opening 18.

The optical sensor 20 visible via the opening 18 of the window layer 10 may be recessed inwardly and may look relatively dark to the user. In case of a black window layer, the opening 18 may not seriously affect the overall exterior appearance. However, in an example of a bright color (such as a white window layer), a dark area seen via the opening 18 may be clearly distinguished from the window layer 15, which may deteriorate the sense of unity in the exterior appearance of the face.

The window layer 220 may include a plurality of fine holes 224 as shown in FIG. 5, rather than the large-sized opening provided in the mobile terminal shown in FIGS. 7-8. The fine holes 224 may be minute-sized holes having a diameter of 0.1 mm or less that are formed in the window layer 220. As a size of the fine hole gets smaller, the user may recognize the region with the fine holes similar to the region with no fine holes. Accordingly, the user may be provided with a sense of unity in a face design.

The amount of lights transmitted via the fine holes 224 of the window layer 220 may be smaller than the amount of lights transmitted via the opening of the window layer 20. However, if the sensitivity of the optical sensor 142 is heightened in a software aspect, even a lesser amount of lights may operate the optical sensor 142 and the smaller amount of the lights may not affect operation of the mobile terminal.

The diameter d1 of the fine hole 224 may be in a range of 0.05 mm to 0.03 mm. If the diameter d1 of the fine hole 224 is less than 0.03 mm, the optical sensor 142 may not be able to sense lights. Accordingly, the diameter d1 of the fine hole 224 may be 0.03 mm or greater, and it may be preferable that the diameter d1 of the fine hole 224 small-sized sufficient for the user not to easily distinguish the region with no fine holes from the other region with the fine holes. It is preferred that the diameter d1 of the fine hole is 0.05 mm or less.

The fine holes 224 may be spaced apart a predetermined distance from each other. As the distance d2 between each two of the fine holes 224 gets larger, the entire area of the fine hole 224 is getting smaller. It is preferred that the distance d2 between the fine holes 224 is large in an aspect of exterior luxury. However, if the distance d2 is too wide, light reception efficiency may be lowered. It is preferred that the distance d2 between the fine holes 224 is set in a range not to deteriorate light reception efficiency. Based on a result of experiments, when the distance d2 between the fines holes 224 is double the diameter d1 of each fine hole 224 (e.g., 0.05 mm or more and 0.1 or less), light reception efficiency may be secured and a sense of unity in an exterior appearance of the front of the mobile terminal 100 may be provided.

The fine holes 224 may be formed by laser processing performed after printing and disposing the window layer 220 on the glass 210. The glass 210 may remove only the window layer 220 by controlling a strength of laser, with no damage.

The plurality of the fine holes 224 may be provided rather than the opening for the optical sensor 142. Light at predetermined wavelengths may pass through the plurality of the fine holes 224. Accordingly, the sense of unity may be achieved with respect to the exterior appearance of the mobile terminal and a gentrified exterior appearance can be achieved.

Figure 9:
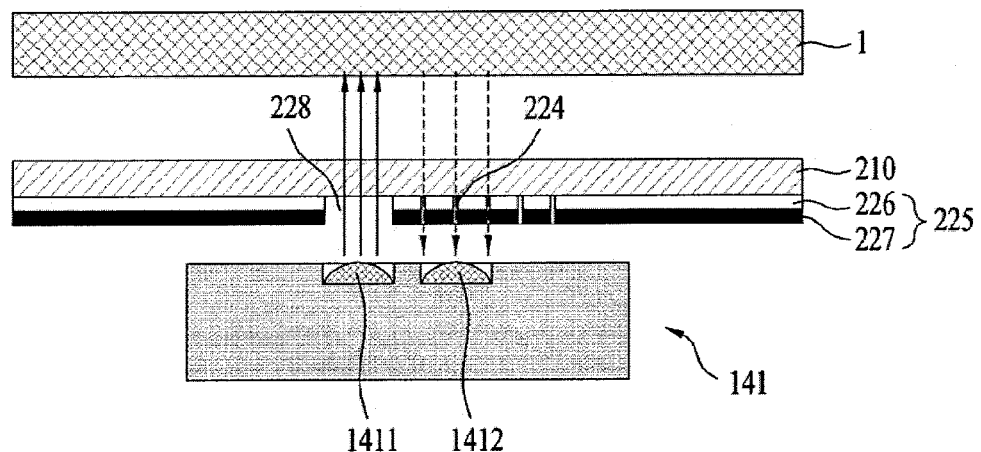
FIG. 9 is a sectional diagram of an optical sensor and a window layer of a mobile terminal according to an embodiment.
Figure 10:
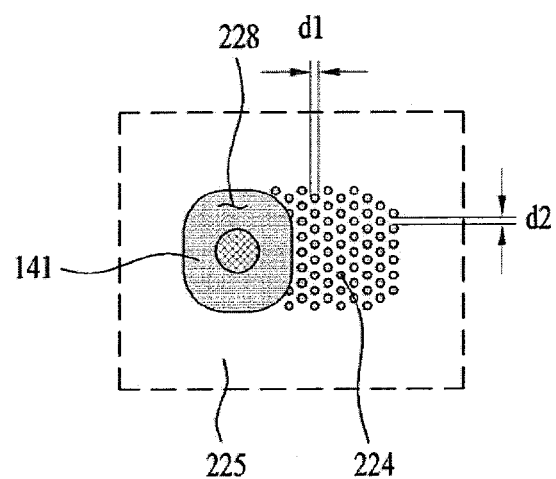
FIG. 10 is a plane diagram of the optical sensor and the window layer of the mobile terminal according to the embodiment of FIG. 9.

FIGS. 9 and 10 show one example embodiment. FIGS. 9 and 10 are sectional and plane diagrams of an optical sensor provided in a mobile terminal according to another example embodiment.

The optical sensor used in this embodiment may be the proximity sensor 141 that includes a light transmitting unit 1411 for output of infrared ray and a light receiving unit 1412 for detecting infrared ray reflected on an object 1 after being outputted from the light transmitting unit 1411.

The proximity sensor 141 is a sensor that can determine proximity of an object. Technologies capable of inputting a user's command without direct touch on a touch screen have been used in mobile terminals. The proximity sensor 141 may have a high relevance to control of the display 151 and the proximity sensor 141 may be positioned closer to the display 151.

The proximity sensor 141 may output light (mainly, near-infrared ray) via the light transmitting unit 1411 and detect the strength of lights incident on the light receiving unit 1412 after being reflected on an object, to determine proximity. The proximity sensor 141 may be configured of the light transmitting unit 1411 and the light receiving unit 1412.

The function of the light receiving unit 1412 may not be affected by usage of the fine holes 224, like the optical sensor 142 discussed above. However, if the fine holes 224 are used in the light transmitting unit 1411, an error may be generated in the light transmitting unit 1411.

Figure 11:
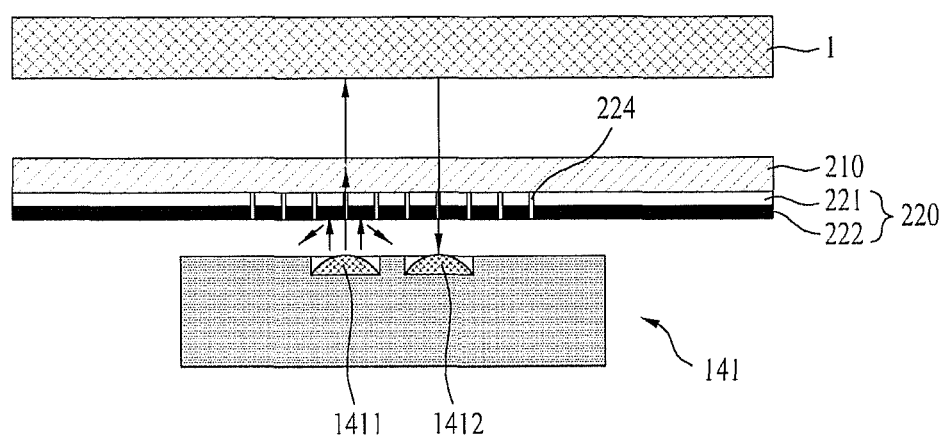
FIG. 11 is a diagram to compare the embodiment of FIG. 9 with another embodiment.

FIG. 11 is a diagram of comparison between the FIG. 10 embodiment and the FIG. 9 embodiment. FIGS. 9-10 show a window layer 225 having the fine holes 224 formed therein is arranged on the proximity sensor 141 provided with the light receiving unit 1412 and the light transmitting unit 1411. When light (e.g., near-infrared ray) is injected from the light receiving unit 1412, some lights may not pass the fine holes 224 and the other lights may collide with the window layer 225 after failing to pass through the fine holes 224 can be reflected toward the light transmitting unit 1411 positioned near the fine holes 224. In this example, the proximity sensor 141 may have a problem of sensing that an object seems to be in close proximity.

To solve such a problem, FIG. 10 shows the fine holes 224 may be formed in a region of the window layer 225 above the light receiving unit 1412 and infrared ray holes (IR holes) 228 may be formed in a region of the window layer 225 above the light transmitting unit 1411, corresponding to a region where lights are injected.

The IR hole 228 may be formed once the window layer 225 is removed from the region where lights are injected from the light transmitting unit 1411 (for instance, an infrared LED). As shown in FIGS. 7 and 8, the size of the IR hole may be reduced to more than that of the opening 18 formed by removing the window layer 15 above the entire optical sensor 20 as shown in FIGS. 7 and 8.

Components of the optical sensor 141 may be seen by the user via the IR hole 228. A visible ray closure ink may be painted on a predetermined area of the glass 210, corresponding to the IR hole 228, to look black to prevent components of the optical sensor 141 from being seen outside.

As shown in FIGS. 10 and 11, the fine holes 224 may be formed in the area of the window layer 225, corresponding to the light receiving unit 1412. The IR holes having the smaller size than the size of the opening 18 may be formed in the area of the window layer 225, corresponding to the light transmitting unit 1411. The dark opening 18 having the large size that is formed in the window layer 15 may decrease as much as possible.

Embodiments may be related to a display module that substantially obviates one or more problems due to limitations and disadvantages of related art.

An object may be to provide a mobile terminal that has a united design of a front surface by reducing a dark region formed by opening a window layer for an optical sensor in a bezel region of a front surface.

The optical sensor may be an illuminance sensor that includes only a light receiving unit for detecting light nearby.

The optical sensor may be a proximity sensor that includes an infrared ray reflected on an object after being outputted from the light receiving unit, and the fine hole formed in the window layer may be positioned above the light receiving unit. The window layer may further include an IR hole formed above the light receiving unit.

Effects of the mobile terminal and control method thereof may be as follows.

According to at least one embodiment, the function of the optical sensor may not deteriorate and a dark region of the opening formed in the window layer, which is formed in the region corresponding to the optical sensor of the front surface, simultaneously.

As a result, an unnecessary part may be omitted in an integrated front surface design and a mobile terminal having a gentrified exterior design.

Various variations and modifications are possible in the component parts and/or arrangements of the subject combination arrangement within the scope of the disclosure, the drawings and the appended claims.

Although embodiments have been described with reference to a number of illustrative embodiments thereof, it should be understood that numerous other modifications and embodiments can be devised by those skilled in the art that will fall within the spirit and scope of the principles of this disclosure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal comprising:
a case having a through hole;
a proximity sensor provided in the case, the proximity sensor includes a light transmitting unit to output a light and a light receiving unit to detect the light after being outputted from the light receiving unit;
a glass to cover the through hole; and
an opaque layer provided behind the glass, the opaque layer having a plurality of first holes provided above the light receiving device, and a second hole provided above the light transmitting device,
wherein the second hole is larger than the first holes, and at least one of the first holes is provided above the proximity sensor,
wherein a diameter of the second hole is within a range of 0.03 mm to 0.05 mm, and
wherein a distance between two of the plurality of first holes is within a range of 0.05 mm to 0.1 mm.

2. The mobile terminal according to claim 1, wherein the optical sensor is an illuminance sensor, and the illuminance sensor includes a light receiving unit to detect light.

3. The mobile terminal according to claim 2, further comprising a controller to control a brightness of a display based on the light detected by the light receiving unit.

4. The mobile terminal according to claim 1, wherein the opaque layer is formed of an opaque material.

5. The mobile terminal according to claim 1, wherein the plurality of first holes of the opaque layer are provided above the light receiving device, and the second hole of the opaque layer is above the light transmitting unit.

6. The mobile terminal according to claim 5, wherein the light is an infrared ray (IR) and the second hole is an IR hole.

7. The mobile terminal according to claim 6, wherein visible ray closure ink is provided on an area of the glass corresponding to the IR hole.

8. The mobile terminal according to claim 1, wherein the opaque layer comprises:
a first layer; and
a second layer, provided under the first layer, to block light from a display.

9. The mobile terminal according to claim 8, wherein the first layer is formed of a white color.

10. The mobile terminal according to claim 1, wherein the plurality of first holes are formed by laser processing after the opaque layer is provided on the glass.

* * * * *